(12) United States Patent
Kasatani

(10) Patent No.: US 6,861,370 B1
(45) Date of Patent: Mar. 1, 2005

(54) BUMP FORMATION METHOD

(75) Inventor: Yasushi Kasatani, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 109 days.

(21) Appl. No.: 10/149,651

(22) PCT Filed: Oct. 23, 2000

(86) PCT No.: PCT/JP00/07400

§ 371 (c)(1),
(2), (4) Date: Jun. 14, 2002

(87) PCT Pub. No.: WO02/35602

PCT Pub. Date: May 2, 2002

(51) Int. Cl.$^7$ ............................................ H01L 21/302
(52) U.S. Cl. ........................................ 438/745; 174/260
(58) Field of Search ................................ 438/745, 754; 174/260, 267; 228/180

(56) References Cited

U.S. PATENT DOCUMENTS

| | | | | |
|---|---|---|---|---|
| 5,282,565 A | * | 2/1994 | Melton | 228/180.22 |
| 5,462,638 A | * | 10/1995 | Datta et al. | 174/260 |
| 6,399,426 B1 | * | 6/2002 | Capote et al. | 438/127 |
| 6,445,001 B2 | * | 9/2002 | Yoshida | 257/48 |
| 6,455,785 B1 | * | 9/2002 | Sakurai et al. | 174/260 |

FOREIGN PATENT DOCUMENTS

| | | | |
|---|---|---|---|
| JP | 60-240142 | 11/1985 | |
| JP | 63-17545 | * 1/1988 | 438/614 |
| JP | 363017545 | * 1/1988 | 438/614 |
| JP | 2-172230 | 7/1990 | |
| JP | 3-138942 | 6/1991 | |
| JP | 4-199771 | 7/1992 | |
| JP | 9-246706 | 9/1997 | |
| JP | 2000-31184 | 1/2000 | |

* cited by examiner

*Primary Examiner*—Kin-Chan Chen
(74) *Attorney, Agent, or Firm*—Leydig, Voit & Mayer, Ltd.

(57) ABSTRACT

A bump formation method and a bump formation apparatus can be gained wherein the reliability of a semiconductor device is enhanced by removing satellites that may be generated by a solder jet-type nozzle. This bump formation method is a method forming a bump on an electrode pad (2) provided on a work piece (1) by using a nozzle (21) of a solder jet system that discharges a molten solder drop (8) and is provided with the coating layer formation step of forming a coating layer (3, 5, 6, 7) having a portion that temporarily protects the work piece (1), the solder drop discharging step of discharging a molten solder drop (8) from the nozzle (21) toward the electrode pad (2) after the coating layer formation step and the coating layer removal step of removing the coating layer (3, 5, 6, 7) in the region other than the region beneath the solder drop formed in the solder drop discharging step.

17 Claims, 12 Drawing Sheets

BUMP FORMATION METHOD

TECHNICAL FIELD

The present invention relates to a bump formation method and a bump formation apparatus for forming a bump on an electrode pad of a work piece (substrate, semiconductor chip, or the like), in particular, to a method for forming a bump electrode and a bump formation apparatus that are used for an electrical connection between a semiconductor chip, or the like, facing downward and a terminal electrode part on a circuit board.

BACKGROUND ART

A variety of techniques for achieving an effective usage of a mounting area by directly connecting a semiconductor chip that is not sealed in resin with a terminal electrode part on a circuit board using a bump have been developed in recent years. For example, according to a method of carrying out bump formation by using wire bonding, a semiconductor chip, or the like, and a terminal electrode part can be connected without fail.

In addition, according to a method for forming a bump on an electrode pad by printing solder paste, a bump can be simply formed so as to easily form the above described connection part.

In the above described wire bonding method, however, a bump is formed due to a complicated movement of a capillary and, therefore, formation requires a long period of time. In addition, the size of the bump electrode primarily depends on wire diameter and, therefore, it is necessary to utilize a wire of a small diameter in order to form a bump electrode of a small diameter that corresponds to a fine pitch of the terminal electrode part. Thus, the ratio of the cost of material for the wire of a small diameter to the cost of bump formation increases. Accordingly, when bump electrodes having many pins with a fine pitch are formed by using a wire bonding method, the cost of bump formation becomes very expensive because of low production efficiency as well as high material costs.

In addition, in the case of a method of forming a solder bump by printing solder paste, there are the demerits wherein instability in the supplied amount of solder paste, which is intrinsic to the printing system, can not be avoided and, moreover, cleaning is necessary after bump formation so that the cost of bump formation cannot be lowered.

Therefore, a bump formation method of a solder jet system that uses the nozzle shown in FIG. 17 is proposed as a new bump formation method. The principle that is conventionally adopted in an ink jet printer, or the like, is applied in this nozzle. Molten solder 108a is heated to the melting temperature, or higher, and is held in this nozzle 121 while an oscillator 122 is placed in the molten solder so that the direction of oscillation faces toward the microscopic aperture 121a. Referring to FIG. 17, whenever an oscillation is applied to the molten solder l08a by means of the oscillator 122, one molten solder drop 108 is discharged from the microscopic aperture 121a of the nozzle. This solder drop is discharged toward an electrode pad on a work piece (substrate, semiconductor chip, or the like) so that a bump joined to the electrode pad is formed. According to this bump formation method having a solder jet system, solder bumps can be formed effectively, simply, and at a low cost.

As shown in FIGS. 18A and 18B, however, there is a case where a microscopic solder drop 109 suddenly and unexpectedly occurs together with an intended solder drop at the stage where the molten solder is discharged from the microscopic aperture 121 a of the nozzle as a predetermined molten solder drop 108. This microscopic solder drop is called a satellite and tends to start occurring after the nozzle has started to be utilized and a predetermined period of time has elapsed. Satellites 109 fly to, and attach to, a substrate that is a work piece, in particular, to the vicinity of an electrode pad.

Here, a solder bump formation method of a solder jet system according to a prior art is described below. Herein, a case where the work piece is a substrate is described. First, as shown in FIG. 19, an electrode pad 102 made of aluminum is formed on the substrate 101. A gold film is used for a layer that the solder bump contacts and a plurality of barrier layers are provided between the two so that the electrode pad and the gold film do not react with each other. First, as shown in FIG. 20, a mask 103 with an aperture is formed so as to correspond to a region of this electrode pad. This mask 103 can be fabricated through a photomechanical process. Next, as shown in FIG. 21, a titanium film 105 is formed on the electrode pad 102 by sputtering through the aperture of the mask 103. Next, a nickel film 106 is formed by sputtering in the same manner on the titanium film 105 (FIG. 22). The titanium film 105 and the nickel film 106 form barrier layers. A gold film 107 that is a connection layer contacting a solder bump is formed on these barrier layers (FIG. 23). After this, mask 103 is removed and a solder bump 108, shown in FIG. 24, is formed by using the above described nozzle of the solder jet system. At this time, as shown in FIG. 18B, satellites 109, in addition to the solder drop 108, occur and satellites 109 attach to the substrate 101 in the vicinity of the electrode pad 102 on the substrate. The satellites that have attached in the vicinity of the electrode pad may possibly bridge the electrode pads causing a malfunction or allowing a disadvantageous phenomenon to occur. It is necessary to remove these satellites in order to provide a high quality semiconductor device w he rein no problem occurs with respect to the reliability of the electrical connection.

DISCLOSURE OF THE INVENTION

A purpose of the present invention is to provide a bump formation method and a bump formation apparatus that enhance the reliability of a semiconductor device by removing satellites, by means of a simple technique, that occur in some cases during a bump formation method of a solder jet system.

A bump formation method according to the first aspect of the present invention is a method of forming a bump on an electrode pad provided in a work piece by using a nozzle of a solder jet system that discharges a molten solder drop. This bump formation method is provided with the coating layer formation step of forming, on a work piece, a coating layer that has a portion which temporarily protects the work piece, the solder drop discharging step of discharging a molten solder drop from a nozzle toward an electrode pad after the dummy film formation step and the coating layer removal step of removing the coat layer in a region other than the region beneath the solder drop formed in the solder drop discharging step.

According to the above described method, even in the case that a satellite attaches to a work piece (substrate, semiconductor chip, or the like) in the solder drop discharging step, the satellite attaches to the coating layer (hereinafter referred to as, in some cases, "dummy film")

and, therefore, the satellite can be removed by removing the a portion of the dummy film together with the satellite. The dummy film may be deposited at any stage during the formation steps of the barrier layers or of the connection layer, to which a solder bump is directly connected, in the electrode pad of the work piece. In addition, the barrier layers, or the connection layer, on the electrode pad may be formed in a manner that is not limited to an area on the electrode pad but, rather, may be formed over the entirety of the work piece so that a portion other than a portion under the solder drop may be used as a dummy layer. This is because the satellite can be completely removed by removing the barrier layers and the connection layer on a portion other than on the electrode pad. Here, the solder in the nozzle is heated the melt temperature, or higher, and is in a molten condition in the above described solder drop discharging step. Though it is desirable for the electrode pad to be heated to a temperature that is in the vicinity of the melt temperature, or higher, so that the solder drop is joined to the electrode pad, it may be at room temperature without being heated.

In the above described bump formation method according to the first aspect of the present invention, the coating layer formation step includes the conductive layer formation step of forming a conductive layer on, for example, an electrode pad and on an area of the work piece other than on the electrode pad while the coating layer removal step includes the conductive layer removal step of leaving the conductive layer unchanged in the portion on which a solder drop is mounted in the above solder drop discharging step while removing the conductive layer in the other portion.

In the above described constitution the solder drop can make an electrical connection with the electrode pad via the conductive layer. In addition; even in the case that the satellite, which is a microscopic solder drop generated at the time of the discharge of the above solder drop from the nozzle, is attached to the work piece, this satellite can be removed at the same time that the conductive layer in the area other than the area below the solder drop is removed. Therefore, it becomes possible to prevent, by means of a simple method, a malfunction of the semiconductor device due to the satellite of the solder drop.

In the above described bump formation method according to the first aspect of the present invention, the coating layer formation step differs from the above description and, for example, includes the insulating film formation step of forming an insulating film on the area of the work aspect other than the electrode pad and the conductive layer formation step of forming a conductive layer on the electrode pad and on the insulating film in an area other than the electrode pad while the coating film removal step includes the conductive layer removal step of removing the conductive layer in a portion other than the portion beneath the solder drop formed in the solder drop discharging step from among the conductive layers formed in the conductive layer formation step and the insulating film removal step of removing the insulating film formed in the insulating film formation step.

In the solder drop discharging step the work piece, for example the substrate, is heated to approximately 185° C., which is the melt temperature of the solder. Therefore, the possibility cannot be eliminated of the occurrence of an undesirable phenomenon such as the phenomenon wherein a conductive material bridges electrode pads so as to make a short circuit when the conductive layer directly contacts the substrate. As described above, there is no possibility for a material transfer to occur from the conductive layer to a portion of the substrate by additionally placing an insulating film as a layer beneath the conductive layer even when the substrate is heated in the solder drop discharging step and, thereby, a semiconductor device having a high reliability can be gained. As for the above described insulating film, a resist film, or a variety of insulating films, can be used.

In the above described bump formation method according to the first aspect of the present invention, in the case that the coating layer formation step includes the conductive layer formation step (in the case that the insulating film formation step is not included), the conductive layer is formed of, for example, a barrier layer made of a metal layer contacting the electrode pad and of a connection layer made of a metal layer that is formed on the above barrier layer and that contacts the solder drop.

As for each of the barrier layers on the electrode pad, a barrier layer and a connection layer contacting the solder are conventionally formed only in the portion on the electrode pad by using a mask having an aperture in a portion corresponding to the electrode pad. This mask is formed by using photomechanical technology and, therefore, many manufacturing steps are required for the formation of this mask which increases the cost of the semiconductor device or which becomes an obstacle to the reduction of the amount of time of delivery schedules. As described above, the barrier layer and the connection layer are formed on the work piece, including the electrode pad, without being limited to the area on the electrode pad and the portion other than the portion beneath the solder drop corresponding to the coating layer is removed through wet etching, or the like, by using the solder drop as a mask. Therefore, the above described photomechanical process is not required in this step and the elimination of many manufacturing steps and the reduction of cost can be implemented.

In the above described bump formation method according to the first aspect of the present invention, the conductive layer is formed of a barrier layer made of a metal layer contacting the electrode pad and of a connection layer made of a metal layer that is formed so as to contact this barrier layer and that contacts the solder drop in the case that the coating layer formation step includes the conductive layer formation step and the insulating film formation step.

In the above described constitution an insulating film is additionally placed as a lower layer in the coating layer and, moreover, the photomechanical process for the mask formation can be obviated in the step of forming a barrier layer and a connection layer on the electrode pad. In the case that an insulating film is formed as a lower layer portion of the coating layer, however, a mask with a hole in an electrode pad portion is, in some cases, used in order to avoid formation of the insulating film in the electrode pad portion. In such a case, a mask for insulating film formation is used and the photomechanical process becomes necessary. Here, it is not necessary to use a mask for each layer of the plurality of layers, such as for the barrier layer or for the connection layer on the electrode pad, according to the prior art and, therefore, a reduction in the number of steps which include, for example, the positioning of the mask, can be implemented.

In the above described constitution, there is no possibility for a material transfer to occur from the conductive layer to a portion of the work piece even when the work piece is heated in the solder drop discharging step and, thereby, a semiconductor device having a high reliability can be manufactured to shorten the amount of time of delivery schedules.

In the above described bump formation method according to the first aspect of the present invention, in the case where the coating layer formation step includes the conductive layer formation step (in the case that the insulating film formation step is not included) and in the case that the coating layer formation step includes the conductive layer formation step and the insulating film formation step, the electrode pad is formed of, for example, aluminum, the barrier layer contains a titanium film and a nickel film and the connection layer contains a metal film.

In the above described constitution an electrode pad is formed of aluminum that is inexpensive and excellent in electrical conductivity and the barrier layer that prevents, without fail, a reaction between the gold film of the connection layer and the aluminum in the electrode pad can be inexpensively formed of a titanium film and a nickel film. Metal films of these respective barrier layers can be conventionally formed through sputtering.

In the above described bump formation method according to the first aspect of the present invention, in the case that the coating layer formation step includes the conductive layer formation step (in the case that the insulating film formation step is not included) and in the case that the coating layer formation step includes the conductive layer formation step and the insulating film formation step, the conductive layer removal step includes the step of the carrying out of the etching by using etchant that etches the conductive layer and etches only to a slight extent comparing with the entirety of the solder bump because the average radius of the solder drops is far larger than the thickness of the above conductive layer.

In the above described constitution, since the radius of the solder drop is very large in comparison with the thickness of the conductive layer, the wet etching can be carried out by using the solder drop as a mask. That is to say, though the solder drop itself is slightly etched and the conductive layer of the portion beneath the solder drop is also etched from the sides as the surrounding portion of the conductive layer is etched, these portions that are etched are slight in comparison with the broadness of the region of the conductive layer beneath the solder drop. Therefore, the portion of the conductive layer beneath the solder drop can be left substantially unchanged while the other portion can be removed through wet etching.

In the above described bump formation method according to the first aspect of the present invention, in the case that the coating layer formation step includes the conductive layer formation step (in the case that the insulating film formation step is not included) and in the case that the coating layer formation step includes the conductive layer formation step and the insulating film formation step, the step of removing the conductive layer is provided with the first metal layer removal step of removing the gold film by using, at least, one of the mixed liquids from among a mixed liquid of iodine and potassium iodide and a mixed liquid of potassium cyanide and oxidizing agent, the second metal layer removal step of removing the nickel film by using, at least, one of the solutions from among ammonium persulfate-based solution and nitrate-based solution and the third metal layer removal step of removing the titanium film by using, at least, one of the mixed liquids from among a mixed liquid of fluoric acid and nitric acid and a mixed liquid wherein a chelating agent is mixed with hydrogen peroxide or with fluoric acid.

The barrier layer made of a titanium layer and a nickel layer as well as the connection layer made of a gold film in the region beneath the solder drop are left unchanged while the layer in the other region that is connected to the above barrier layer can be removed through wet etching by using the above described chemical solution. Therefore, the mask formation through the photomechanical process becomes unnecessary and the satellite attached to the gold film after the formation of the gold film can be removed by means of this removal process through wet etching.

In the above described bump formation method according to the first aspect of the present invention, in the case that the coating layer formation step includes the conductive layer formation step and the insulating film formation step, the insulating film removal step preferably includes the step of removing the insulating film by using a chemical solution that is not mutually soluble with solder.

In the above described constitution, the insulating film can be removed without influencing the solder drop. Therefore, the satellite can be removed by removing a dummy film that includes the insulating film as a lower layer so that a semiconductor device of high reliability can be gained.

In the above described bump formation method according to the first aspect of the present invention, the insulating film is a resist film while the insulating film removal step can include the resist film removal step wherein the resist film is peeled off by using, for example, organic alkaline peeling liquid.

A thick resist film can be completely removed in a short period of processing time by using the organic alkaline peeling liquid.

A bump formation apparatus used in the above described bump formation method according to the first aspect of the present invention is provided with an insulating film formation part for forming an insulating film that contacts the work piece, a conductive film formation part for forming a conductive film that contacts the insulating film, a solder drop discharging part having a nozzle of a solder jet system that discharges a molten solder drop and a work piece conveyance support that conveys a work piece, a conductive film removal part for removing a conductive film and an insulating film removal part for removing an insulating film.

In the above described constitution, the conductive film formation part forms a conductive layer that is interposed between the electrode pad and the solder drop and, after that, a solder drop is discharged onto the electrode pad of the work piece by using the nozzle of the solder jet system and the work piece conveyance support so that the solder drop is connected to the electrode pad with the conductive film interpolated between them. At this time, a satellite that is generated according to a very low probability attaches to the above conductive film. After this, the above conductive film on the work piece in the region other than the region below the above described connected solder drop is removed and, thereby, the satellite that may possibly become attached is removed so that a semiconductor device of a high reliability can be gained. Furthermore, in the case that the insulating film is formed, a resist film is deposited on the work piece, not including on the electrode pad, and after discharging the solder drop and after removing the conductive film the resist film can be removed. In this case, by removing the conductive film that forms an upper layer part of the dummy film, the satellite is removed and the disadvantage wherein the conductive film directly contacts the work piece can be avoided. In the case that the above insulating film is, for example, a positive resist film, the solvent that includes the resist composite is applied to the entirety and the electrode pad portion is masked so that the portion other than the electrode pad is irradiated and cured so as to remove the electrode pad portion. The above described insulating film formation part refers to, for example, an apparatus that forms the above described resist film.

In the above described bump formation apparatus of the present invention, the conductive film formation part is, for example, a metal film formation part that layers a plurality of metal film layers while the conductive film removal part can be a metal film removal part that removes a plurality of metal film layers. As for the above described metal layer formation part, sputtering apparatuses, or the like, can be used. The conductive film can be made, by using these sputtering apparatuses, or the like, of a plurality of metal film layers formed of a barrier layer that contacts the electrode pad and of a connection layer that contacts the barrier layer and the solder drop. In this constitution, no mask is required for forming a barrier layer and a connection layer on the electrode pad. As a result, the manufacturing steps of the photomechanical process can be eliminated and the cost can be reduced.

A bump formation method according to the second aspect of the present invention is a method of forming a bump on the electrode pad provided on a work piece by using a nozzle of a solder jet system that discharges a molten solder drop. This bump formation method discharges a molten solder drop from the nozzle toward the electrode pad and prevents a satellite, which is a microscopic molten solder drop that may occur accompanying the discharge of the molten solder drop, from becoming attached to the work piece by blowing a gas between the nozzle and the work piece in the direction crossing the direction in which the molten solder drop is discharged.

The molten solder drop is discharged with a predetermined kinetic energy in the direction from the above described nozzle of the solder jet system toward the electrode pad. In addition, the solder drop receives a force in the direction of crossing the above described discharge direction from the emitted gas blown out toward the solder drop. The period of time of flight of the solder drop after being discharged until the work piece is reached is determined by the initial velocity at the time of discharge wherein gravity exercises little influence. Since this period of time of flight is short, the solder drop that is to form the bump does not receive the influence of the above blown out gas to a degree to cause it to substantially miss the electrode pad. Since the satellite does not have an initial velocity as great as the solder drop that is to form the solder bump, and has a long period of flight time, the distance of shift in the crossing direction due to the blown out gas becomes large. Therefore, it becomes possible to blow out the satellite alone so that it does not reach the work piece.

In the above described bump formation method according to the second aspect of the present invention, at least one of the nozzle position, the nozzle direction or the work piece wherein the electrode pad is provided is placed so as to be shifted in advance by estimating the distance of shift of the solder drop due to the blown out gas so that the solder drop that is to form the solder bump reaches the electrode pad.

In the above described constitution, no matter how strong is the blown out gas that is used, the solder drop can be made to precisely reach the electrode pad while the satellite can be blown out so that it does not reach the work piece. Therefore, a semiconductor device of a high reliability can be easily formed.

In the above described bump formation method according to the second aspect of the present invention, it is desirable for the gas to be, at least, either of, for example, an inactive gas or a reducing gas.

Since the molten solder drop reaches to the electrode pad without the surface thereof being oxidized by using the above described gas, a connection that secures electrical conductivity can be gained.

In the above described bump formation method according to the second aspect of the present invention, the gas is of the temperature in the temperature range of from room temperature to the melt temperature of solder.

The solder drop reaches the electrode pad while maintaining the molten condition through the blowing out of the gas that is heated to the above described temperature range and, therefore, a connection that secures electrical conductivity can be easily gained.

The bump formation apparatus of the present invention is provided with a nozzle of a solder jet system that discharges molten solder, a work piece conveyance support that conveys a work piece and a gas blowing nozzle that blows out a gas in the direction that crosses the direction of the nozzle between the above nozzle and the work piece conveyance support.

Since the above described gas blowing nozzle is provided, the satellite can be blown out so that, for example, it does not reach the work piece and, thereby, a malfunction due to the satellite can be prevented. Therefore, it becomes possible to manufacture a semiconductor device of a high reliability.

In the above described bump formation apparatus of the present invention, at least one of the position of the nozzle of the solder jet system, the direction of the nozzle or the position of the work piece arranged so as to shift from the arrangement of the case wherein no gas is blown out from the gas blowing nozzle by estimating the distance L of shift of the solder drop due to the gas blown out from the gas blowing nozzle.

The solder drop can be made to precisely reach the electrode pad and the satellite can be blown out so that it does not reach the work piece by using this bump formation apparatus, even in the case that the blown out gas used is very strong. Therefore, a semiconductor device of a high reliability can be easily formed.

BRIEF DESCRIPTION OF THE DRAWINGS

FIGS. 16A and 16B are schematic views showing another bump formation apparatus according to the fourth embodiment of the present invention, wherein FIG. 16A is a view showing the distance L of shift of a standard solder drop in the horizontal direction due to a blown gas while FIG. 16B is a view showing the arrangement wherein the nozzle and the substrate position are shifted by estimating, in advance, the distance of shift in that horizontal direction;

FIGS. 18A and 18B are views showing the process of the generation of satellites, wherein FIG. 18A is a view showing the condition wherein molten solder is pushed out from a microscopic aperture of the nozzle while FIG. 18B is a view showing the outlook, which has progressed from the condition in FIG. 18A, of the generation of satellites at the base portion of the solder drop at the time when the solder drop is released from the microscopic aperture;

BEST MODE FOR CARRYING OUT THE INVENTION

First Embodiment

Figure 1:
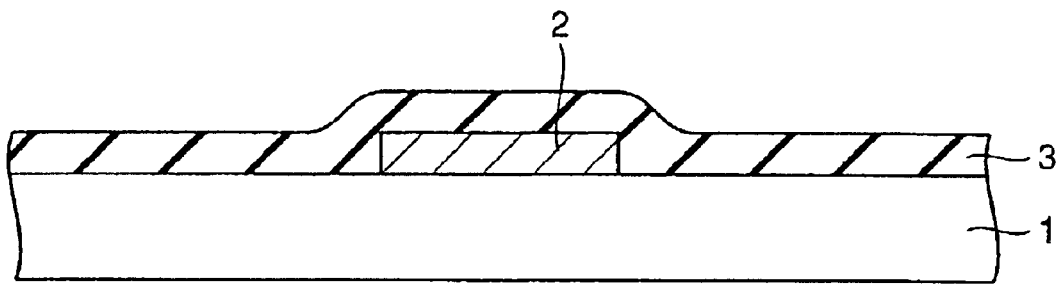
FIG. 1 is a cross sectional view of a phenol novolac-based positive resist agent on a substrate that has an aluminum electrode pad, in a bump formation method according to a first embodiment of the present invention.
Figure 2:
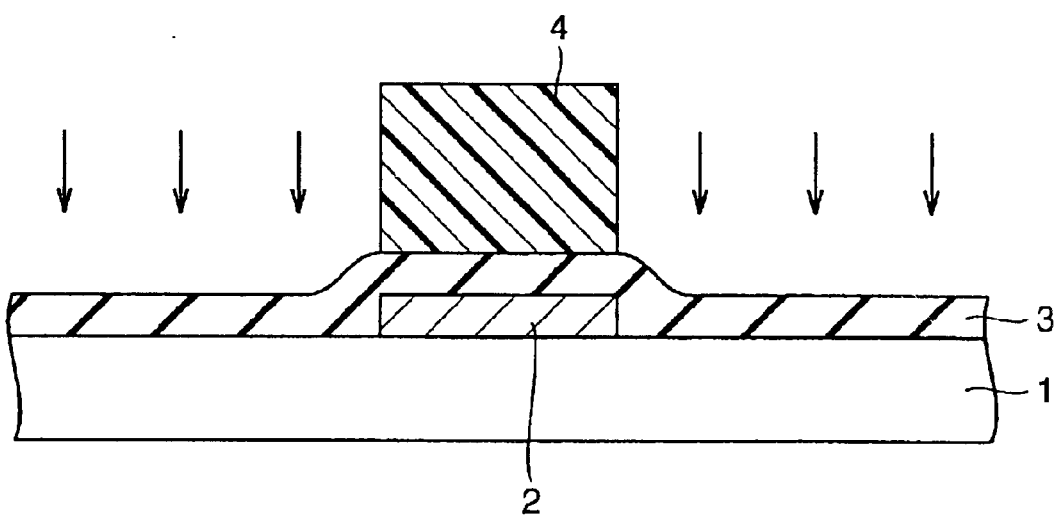
FIG. 2 is a cross sectional view showing a condition wherein a mask is formed on the substrate of FIG. 4, which is irradiated with a curing beam, such as ultraviolet light.
Figure 3:
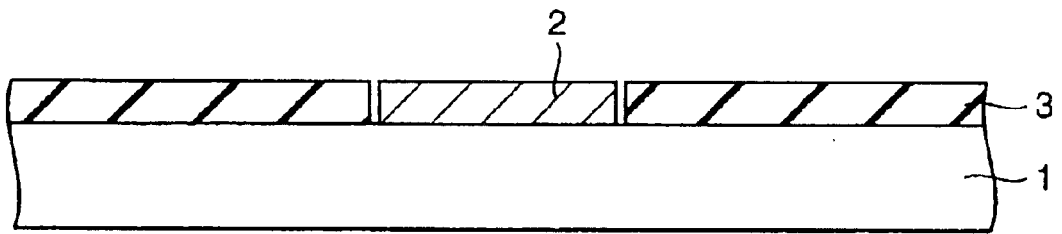
FIG. 3 is a cross sectional view after the mask has been removed and, then, the resist film in the uncured portion (on the electrode pad) is removed.
Figure 4:
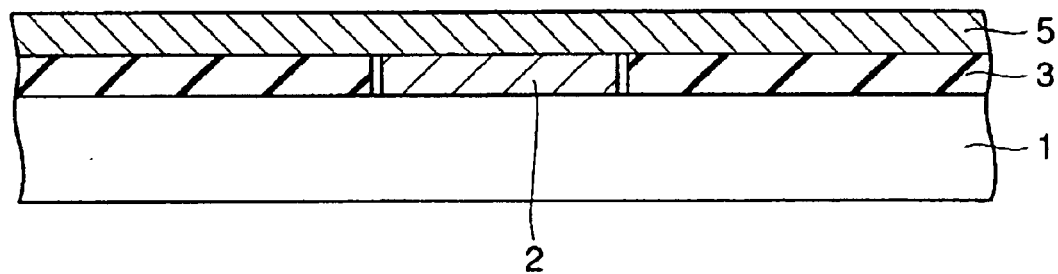
FIG. 4 is a cross sectional view with a titanium film formed by sputtering on the substrate of FIG. 3.
Figure 5:
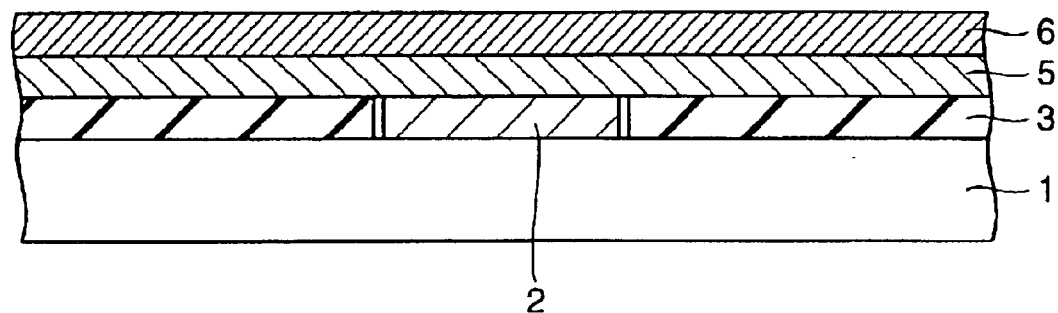
FIG. 5 is a cross sectional view with a nickel film formed by sputtering on the substrate of FIG. 4.
Figure 6:
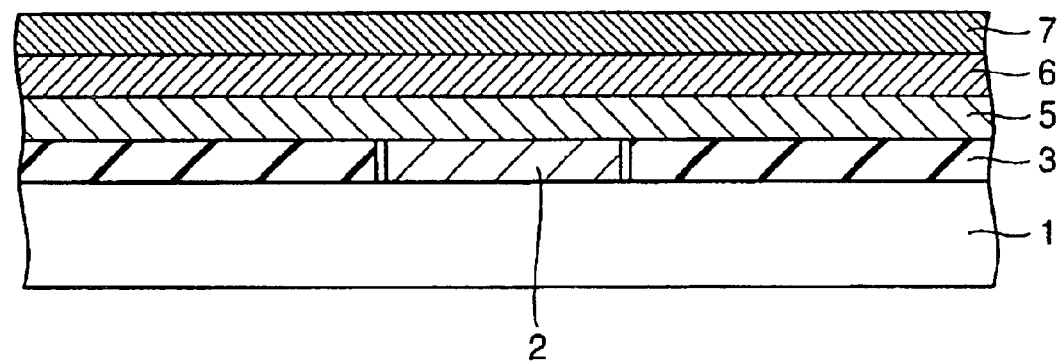
FIG. 6 is a cross sectional view with a gold film formed by sputtering on the substrate of FIG. 5.

A bump formation method according to a first embodiment of the present invention is described referring to FIGS. 1 to 8. In FIG. 1, a resist film 3 that is an insulating coating layer is thinly applied to a substrate 1 that has an aluminum electrode pad 2. As for the resist film, for example, a phenol novolac-based positive resist can be used. A mask 4 that has openings in a portion other than in the portion above the electrode pad 2 is formed by means of a photomechanical process, or the like, and, as shown in FIG. 2, the resist film in the region other than the region above the electrode pad is cured by irradiation of an ultraviolet ray, or the like. The resist film that is not cured can be easily removed from the electrode pad or from the substrate by using a peeling liquid, or the like. By carrying out the above described peeling process, as shown in FIG. 3, resist film 3 that covers the entire surface of the substrate with the exception of the electrode pad is formed. This resist film 3 need not have the same thickness electrode pad 2 but, rather, may be thicker or thinner than the electrode pad. Next, a barrier layer made of a titanium film and a nickel film is formed. First, a titanium film 5 that makes up the lower layer of the barrier layer is formed on the electrode pad and on the resist film through sputtering (FIG. 4). Next, as shown in FIG. 5, a nickel layer that makes up the upper layer of the barrier layer is formed through sputtering. Then, a gold film 7 that is a connection layer for contacting a solder bump is formed through sputtering.

Figure 7:
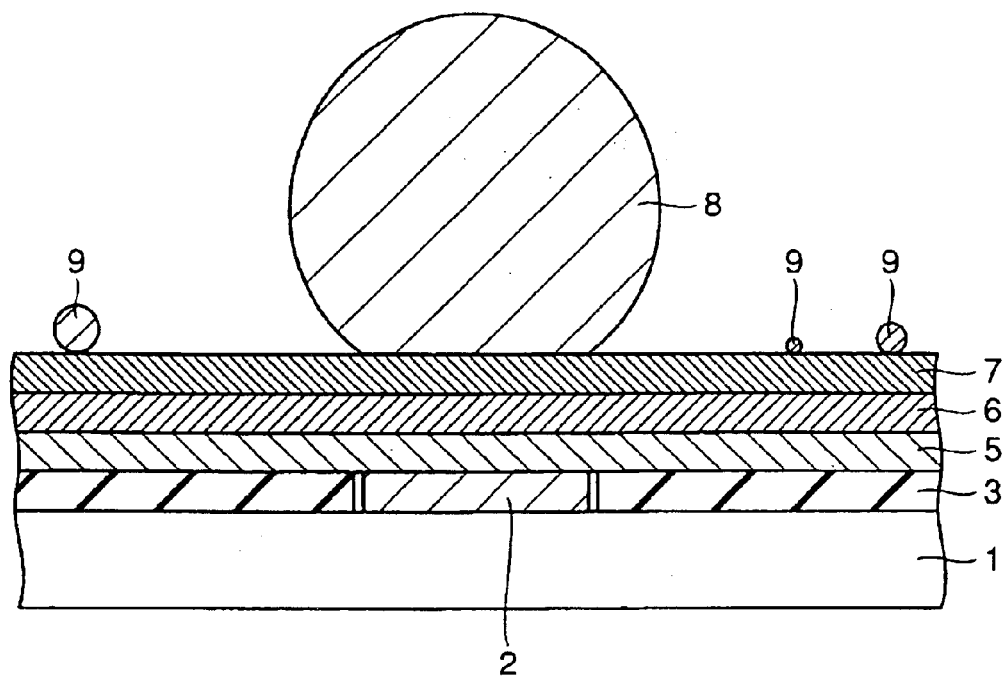
FIG. 7 is a cross sectional view of a solder drop discharged from a solder jet-type nozzle so that the solder drop is connected to the substrate of FIG. 6.
Figure 8:
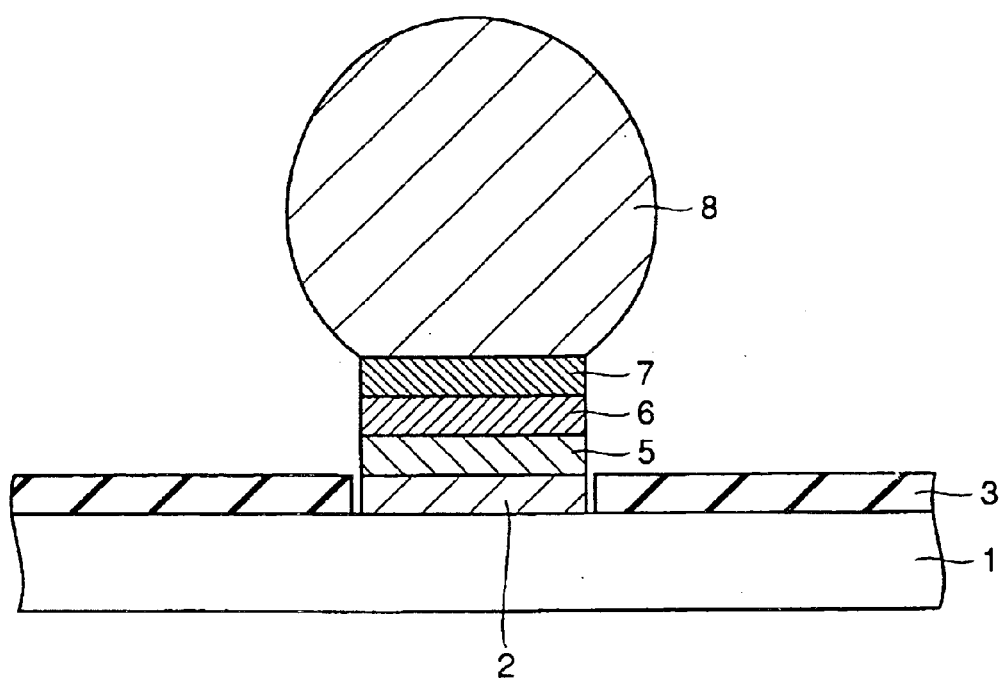
FIG. 8 is a cross sectional view of the stage wherein a metal film is removed by wet etching.
Figure 18A:
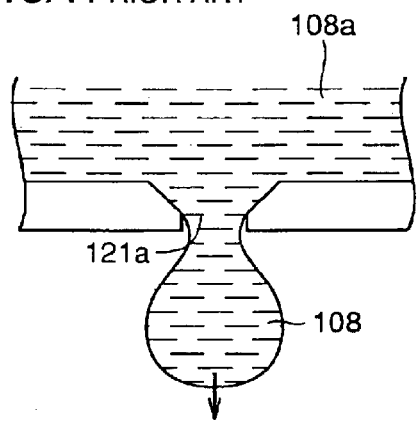
Figure 18B:
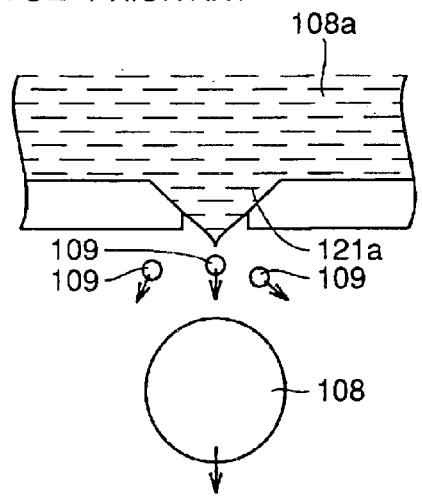
Figure 19:
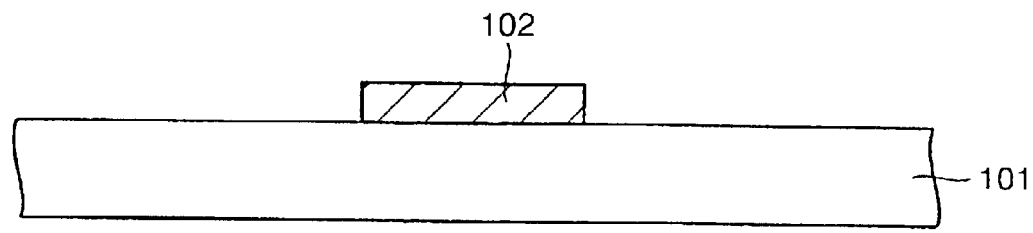
FIG. 19 is a cross sectional view showing a substrate having an aluminum electrode bump in the bump formation method of a solder jet system according to a prior art.
Figure 20:
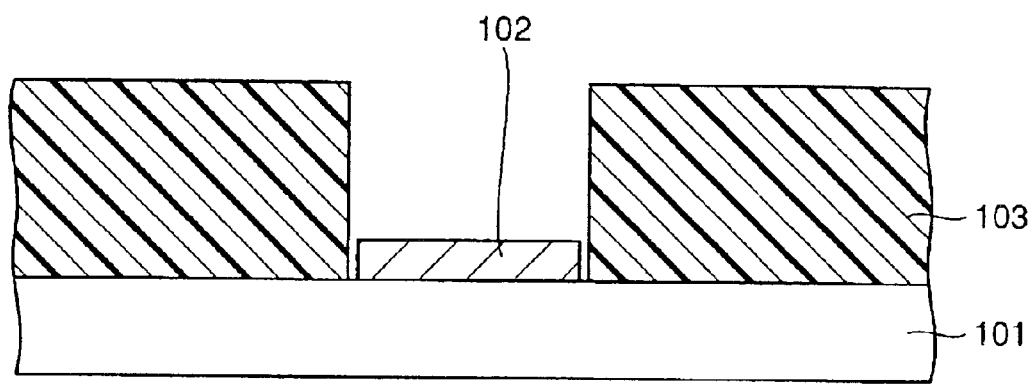
FIG. 20 is a cross sectional view showing a mask having an aperture in the position of the electrode pad.
Figure 21:
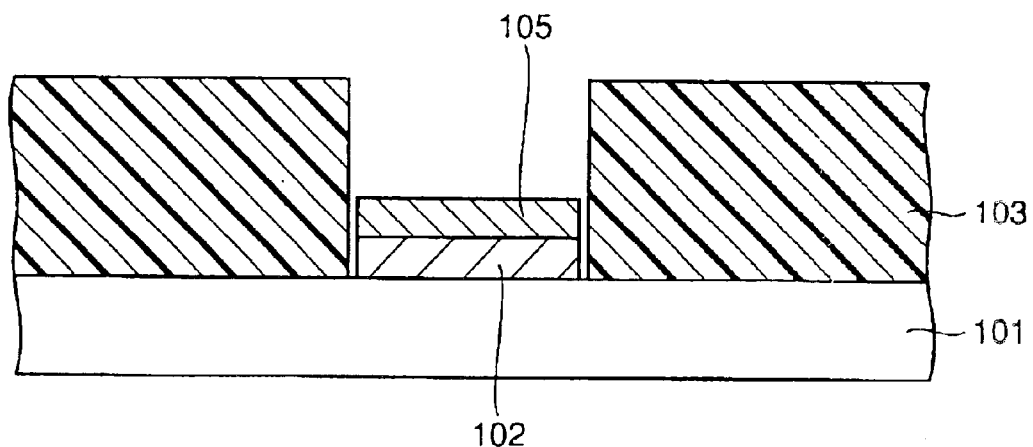
FIG. 21 is a cross sectional view of a titanium film formed by sputtering on the aluminum electrode pad on the substrate of FIG. 20.
Figure 22:
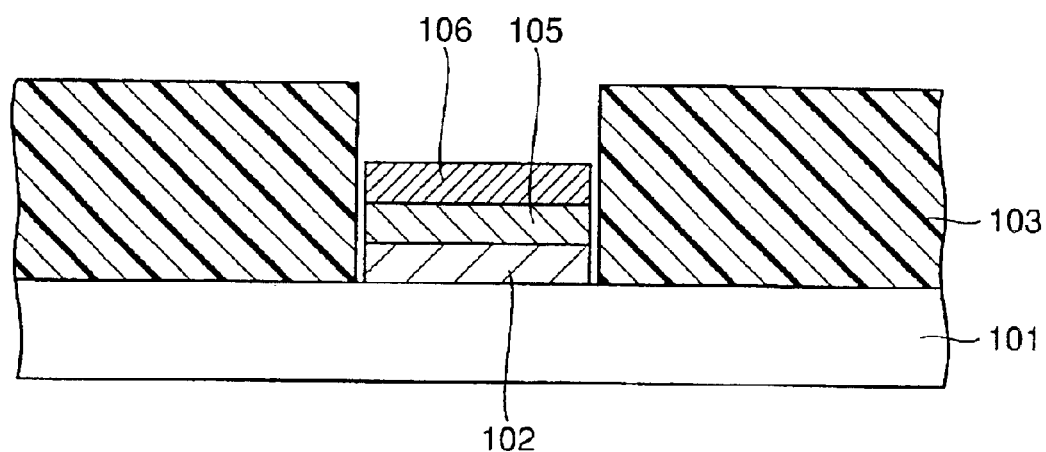
FIG. 22 is a cross sectional view of a nickel film formed by sputtering on the titanium film on the substrate of FIG. 21.
Figure 23:
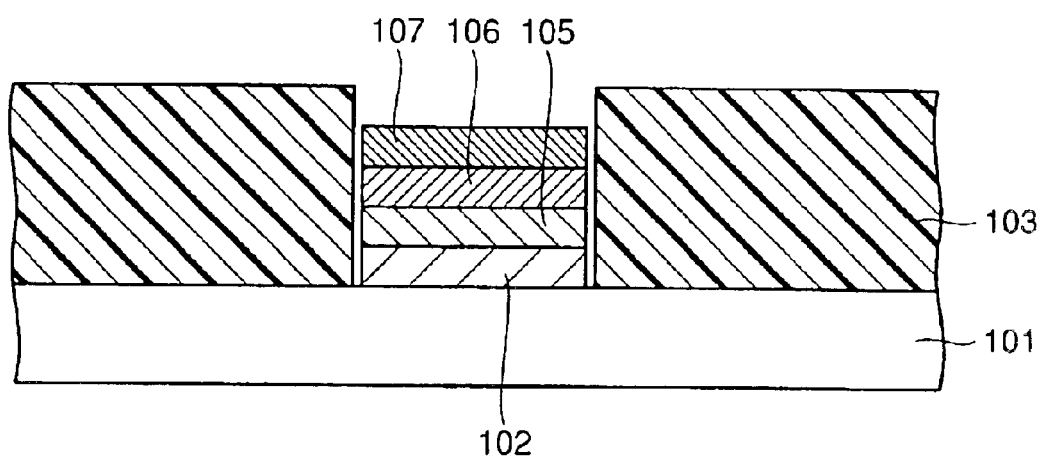
FIG. 23 is a cross sectional view of a gold film on the nickel film on the substrate of FIG. 22.
Figure 24:
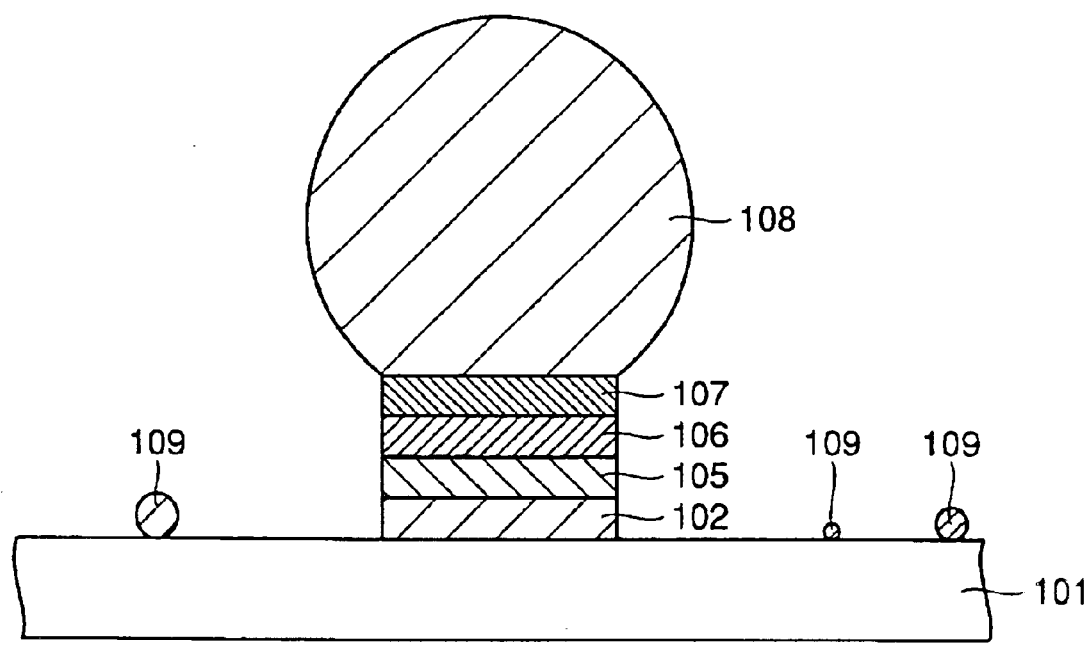
FIG. 24 is a cross sectional view of a solder drop discharged through a solder jet-type nozzle so that the solder drop becomes connected after the mask is removed from the substrate of FIG. 23.

Then, a solder drop 8 is discharged onto gold film 7 in a position corresponding to the electrode pad by using a nozzle of a solder jet system while the entire substrate is heated up to approximately 183° C. so that a solder bump is joined to the gold film. At this time, as shown in FIG. 18B, in some cases satellites are generated and, as shown in FIG. 7, satellites 9 become attached to the surface of the gold film in the vicinity of the solder bump. After the condition of FIG. 7, gold film 7, nickel film 6 and titanium film 5 in the region other than the region beneath the solder drop are removed through wet etching, as shown in FIG. 8. In etching these films, etchants of which the etching rates for respective metal films are greater than the etching rate for the solder drop are used. These etchants are described in the following. Though at the stage shown in FIG. 8, resist film 3 remains deposited on the substrate with the exception of on the electrode pad, afterwards this resist film 3 is also peeled off and removed from substrate 1 by using a peeling liquid.

Then, the etchants for the barrier layer and the connection layer that are conductive layers as well as peeling liquid for the resist film are described.

Gold film is etched by using, at least, one of the mixed liquids from among a mixed liquid of iodine and potassium iodide and a mixed liquid of potassium cyanide and oxidizing agent.

Nickel film is etched by using, at least, one of the solutions from among ammonium persulfate-based solution and nitrate-based solution.

Titanium film is etched by using, at least, one of the mixed liquids from among a mixed liquid of fluoric acid and nitric acid and a mixed liquid wherein a chelating agent is mixed with hydrogen peroxide or with fluoric acid.

Phenol novolac-based positive resist film is peeled off by using an organic alkaline peeling liquid.

Even in the case that satellites are generated at the time when a solder drop is discharged by using a nozzle of a solder jet system, the coating layer on the substrate to which the satellites have become attached is removed by using the above described bump formation method and, therefore, the satellites can also be removed. A mask used in a conventional bump formation method is not used for the barrier layer and the connection layer in the electrode pad beneath the above described solder bump so that the number of steps and production cost reduced. As a result of this, a semiconductor device having a high reliability can be provided at a low cost and so as to shorten the amount of time of delivery schedules.

Second Embodiment

Figure 9:
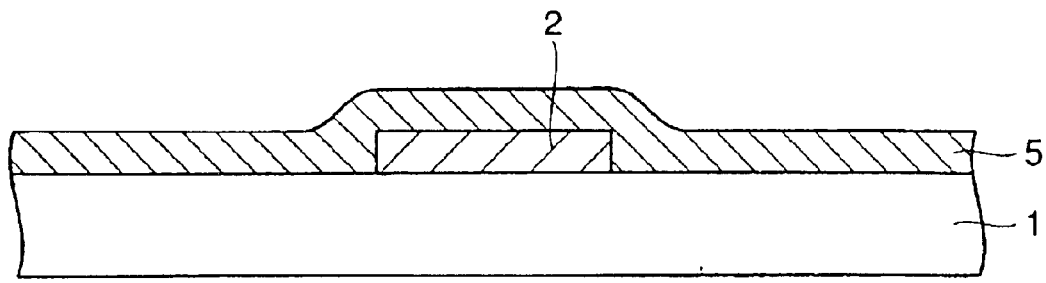
FIG. 9 is a cross sectional view of a titanium film formed by sputtering on a substrate that includes an aluminum electrode pad, in a bump formation method according to a second embodiment of the present invention.
Figure 10:
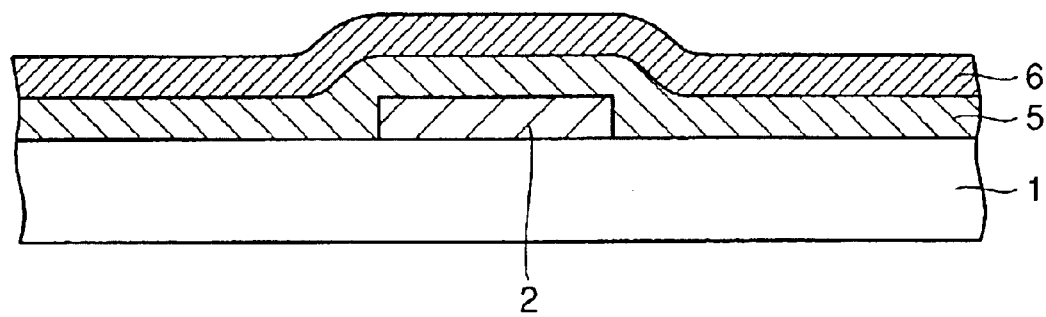
FIG. 10 is a cross sectional view of a nickel film formed by sputtering on the substrate of FIG. 9.
Figure 11:
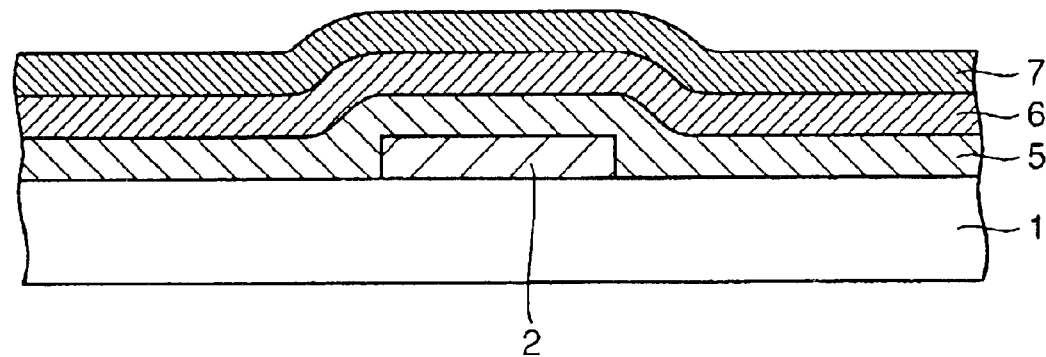
FIG. 11 is a cross sectional view of a gold film formed by sputtering on the substrate of Fig. 10.

FIGS. 9 to 13 show a bump formation method according to a second embodiment of the present invention. In this second embodiment the substrate is not covered with a resist film that is an insulating film unlike the first embodiment. First, as shown in FIG. 9, a titanium film 5 is formed on a substrate 1 having an aluminum electrode pad 2 through sputtering and, then, a nickel film 6 is formed on the titanium film (FIG. 10). The titanium film and the nickel film, respectively, form the lower layer and the upper layer of a barrier layer. Next, as shown in FIG. 11, a gold film 7 that is a connection film is layered on nickel film 6.

Figure 12:
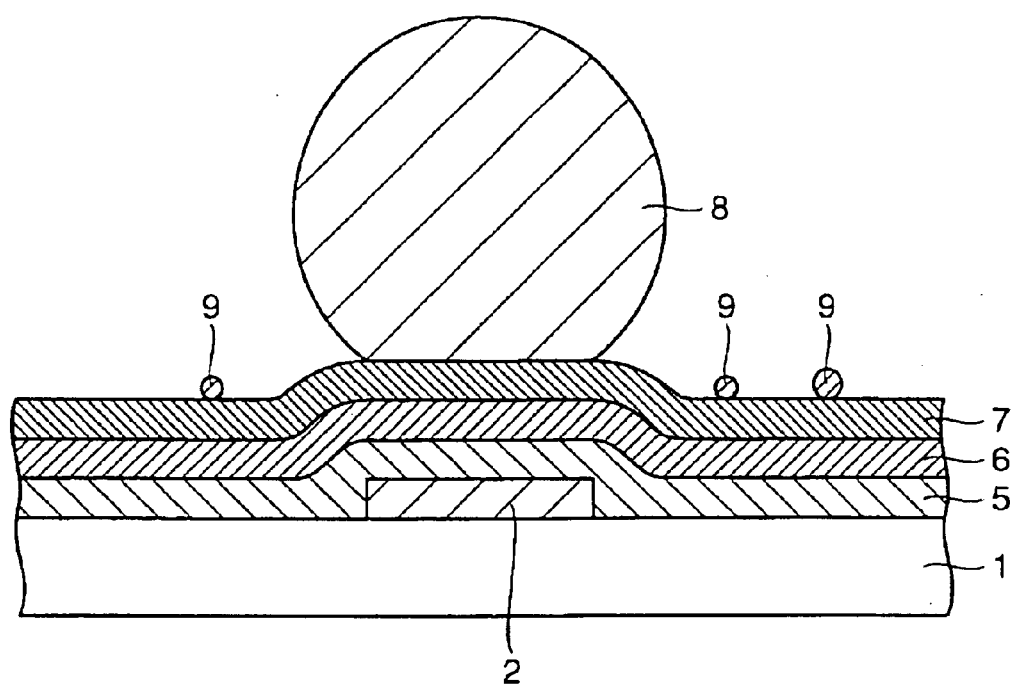
FIG. 12 is a cross sectional view of a solder drop discharged and connected to the substrate of FIG. 11 through a solder jet-type nozzle.
Figure 13:
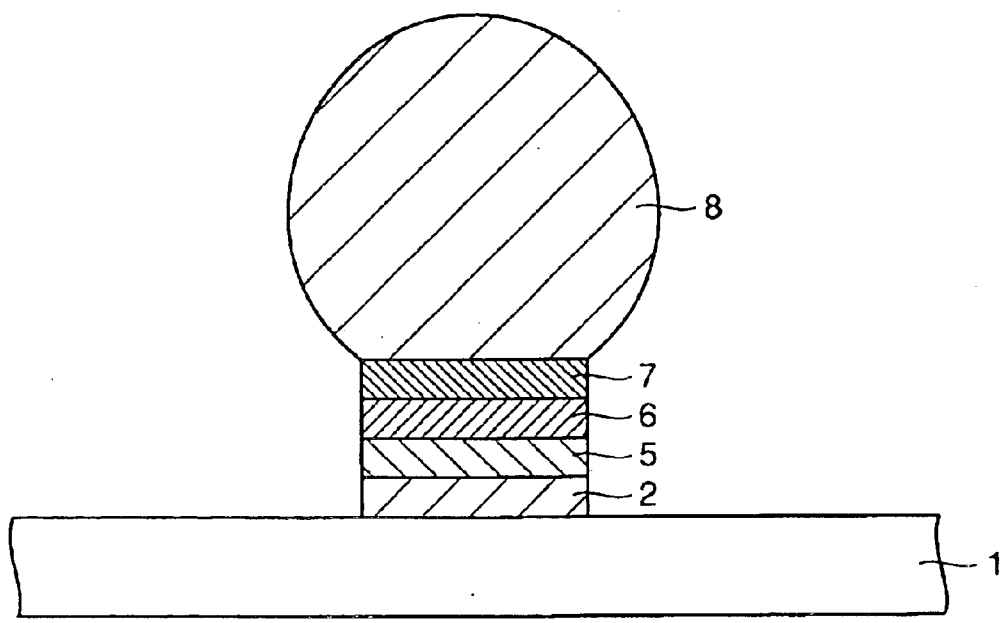
FIG. 13 is a cross sectional view of etching carried out on the substrate of FIG. 12 to remove a metal film.

After this, the entire substrate is heated up to the vicinity of the solder melt temperature and a solder drop is discharged from a nozzle of a solder jet system so as to form a solder bump 8 as shown in FIG. 12. At this time, as described above, satellites 9 are generated and the satellites become attached to the area surrounding the solder bump. These satellites, however, can be completely removed as shown in FIG. 13 by etching respective metal films using the etchants described in the first embodiment.

In this second embodiment, in addition to the removal of the negative effects of the satellites, a resist film is not used and, thereby, no mask is utilized so that a great reduction in the number of steps and in cost can be implemented. However, since a resist film is not used, the possibility of the generation of a metal particle group, or the like, that makes a bridge between electrode pads cannot be completely nullified.

Third Embodiment

Figure 14:
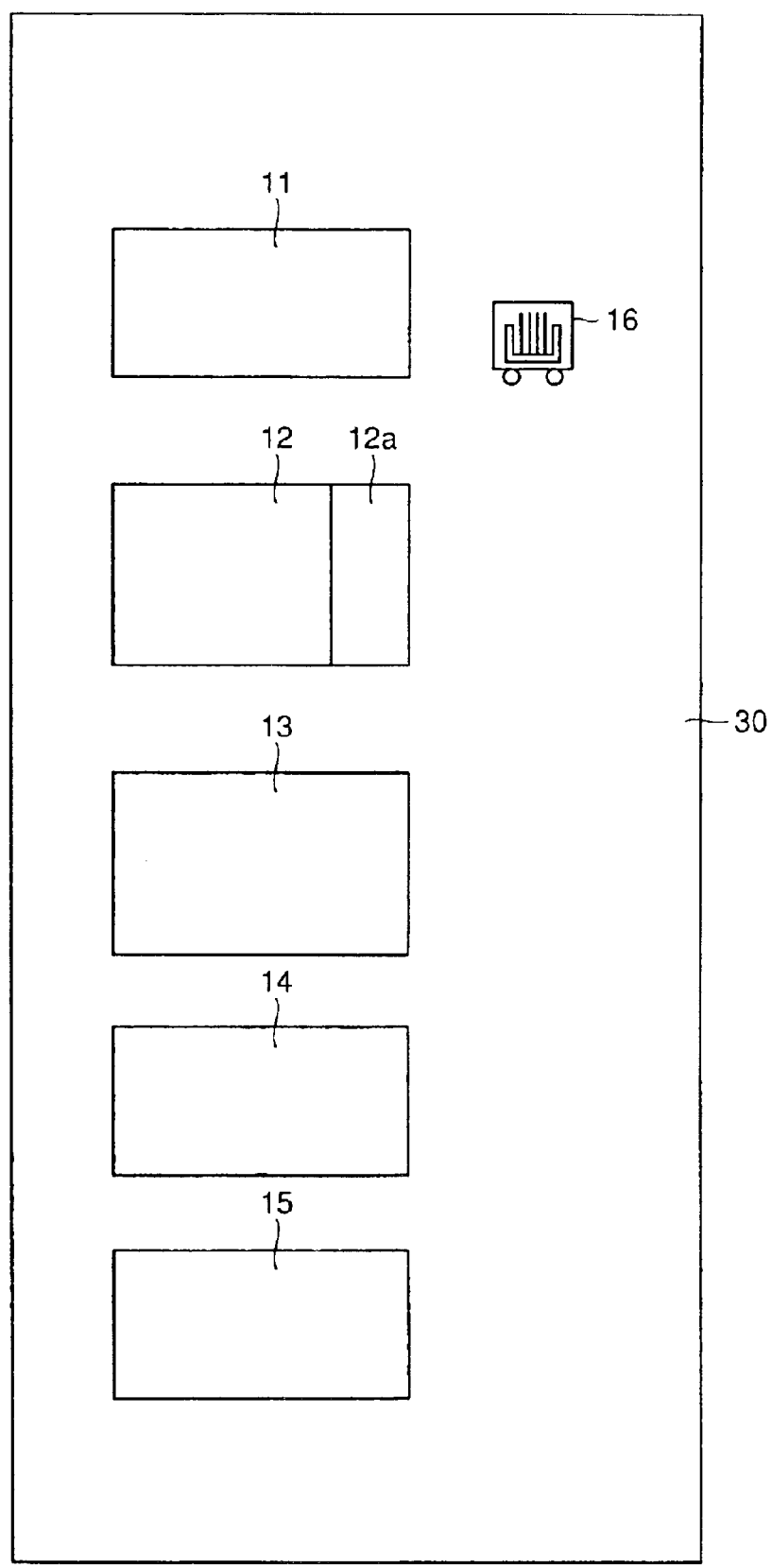
FIG. 14 is a layout view of a bump formation apparatus according to a third embodiment of the present invention.

Next, a bump formation apparatus used in the bump formation method of the first embodiment is described in a third embodiment of the present invention. FIG. 14 is a layout diagram showing a bump formation apparatus according to the third embodiment of the present invention. All of the apparatus parts that form this bump formation apparatus are placed within a clean room 30. In the case that the work piece is a substrate, first, a resist film is formed on the substrate by means of a resist film formation apparatus 11 that is an insulating film formation part. Here, first, a phenol novolac-based positive resist agent is applied and, then, a process is carried out for removing the resist film only in the portion above the electrode pad by using a mask formed through a photomechanical process. Then, the substrate is conveyed, by a conveyance apparatus 16, to an in/out loader part 12a of a sputtering apparatus 12 that is a conductive layer formation apparatus. A titanium film, a nickel film and a gold film are sequentially layered, through sputtering in the sputtering apparatus, on the substrate that has been taken out of conveyance apparatus 16 and on which a resist film has been formed. These metal films are formed over the electrode pad and the substrate. That is to say, each sputtering is carried out over the entire surface. Then, the substrate that has again been loaded into the conveyance apparatus is conveyed into a solder drop discharging part 13 wherein a nozzle of a solder jet system is located and wherein a solder drop is joined to the gold film on the electrode bump while the substrate is heated to approximately 175° C. Then, the substrate to which the solder drop is joined is conveyed, by the conveyance apparatus, into a wet etching apparatus part 14 that is a conductive film removing part and that has three, or more, types of chemical tanks (not shown). In this apparatus portion the gold film is etched are removed by means of a mixed liquid of iodine and potassium iodide in a gold film removing tank. In addition, in a nickel film removing tank, the nickel film is removed by a commercially available ammonium persulfate-based (alkaline) etchant. Then, in a titanium film removing tank, the titanium film is removed by a mixed liquid of fluoric acid and nitric acid. In the above described removal process of the metal films, the metal films in the portion, other than the portion beneath the solder bump, are removed while the metal films in the portion beneath the solder bump remain without being etched. That is to say, only the portions of the metal films that function as dummy films are removed through the above etching. Here, the substrate is washed by pure water and is loaded into the conveyance apparatus.

The substrate, from which the dummy portions of the metal films have been removed, is then conveyed by conveyance apparatus 16 into a resist film removing part 15 that is an insulating coating film removing part. Here, a commercially available organic alkaline peeling liquid is used so that the above described phenol novolac-based positive resist is peeled off and removed from the substrate. Finally, here, washing by pure water is carried out again.

The satellites can be completely removed by using the above described bump formation apparatus and by forming the dummy films of the metal films and of the resist film so that it becomes possible to provide a semiconductor device of a high reliability. Here, the dummy films can be formed of only the metal films without using, from among respective apparatus parts shown in FIG. 14, either resist film formation part 11, which is the insulating film formation part, or resist film removing part 15, which is the insulating coating film removing part.

Fourth Embodiment

Figure 15:
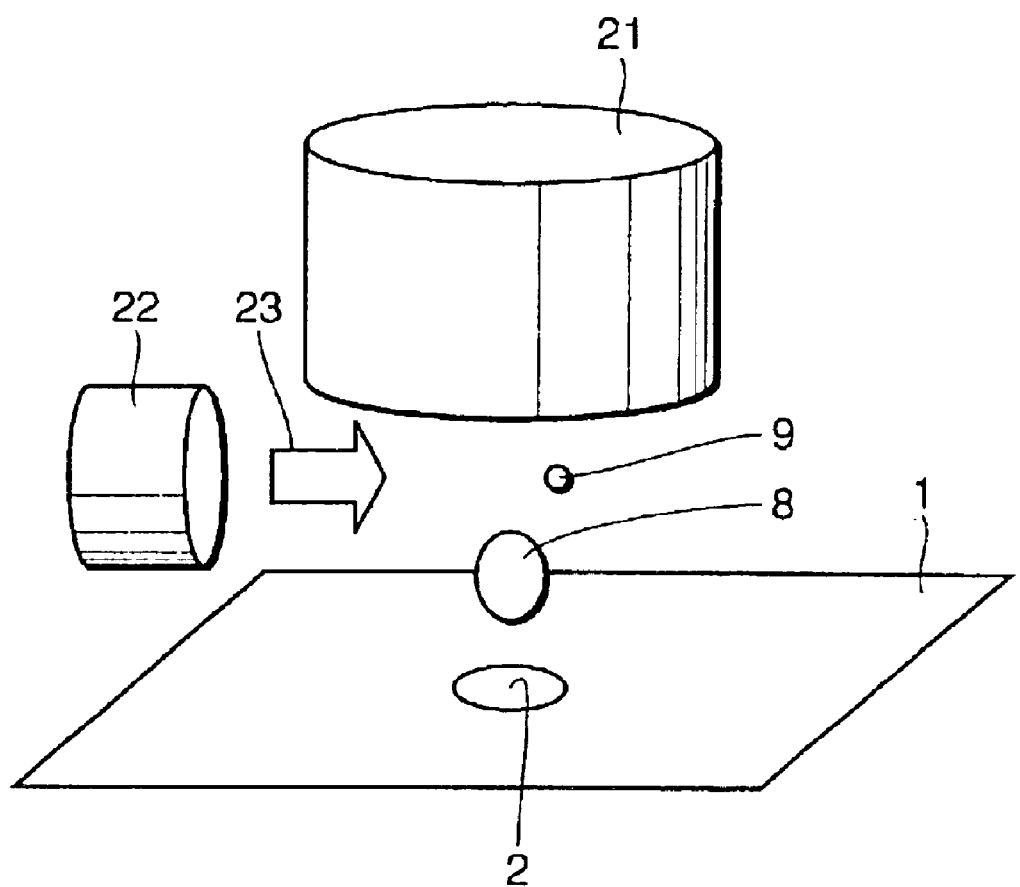
FIG. 15 is a perspective view showing a bump formation apparatus according to a fourth embodiment of the present invention.

FIG. 15 is a perspective view showing the principle of a bump formation apparatus according to a fourth embodiment of the present invention. In the present bump formation apparatus, a nozzle 22 for blowing gas in the horizontal direction 23 is placed between a solder jettype nozzle 21 and a substrate 1. This nozzle 22 may blow gas according to the timing of the discharge of a solder drop 8 or may continuously blow while a work piece is being conveyed. Since the mass of the solder drop that forms a bump is large and since the initial velocity of the solder drop at the time of being pushed out and downward by means of an oscillator (not shown), the distance of the solder drop shifting in the horizontal direction is small even in the case that gas is blown from the side. Therefore, though the solder drop may shift slightly in the horizontal direction, it settles in the range of the electrode pad. On the other hand, a satellite 9 has a small mass and the factor of the initial velocity in the direction toward the substrate of the satellite at the time of being generated by separating from the solder drop is not so large as that of the solder drop that forms the bump. Therefore, the flight time until the satellite reaches substrate 1 is long so that the satellite can be blown out of the substrate by means of the above described gas blowing. Here, the above described substrate is heated to approximately 185° C. and it is desirable for the blown gas to also be heated to approximately 185° C. by a heater (not shown).

As a result of this, satellites are removed by using a simple apparatus and, thereby, it becomes possible to provide a semiconductor device of a high reliability.

In the above described bump formation method, there may be a case wherein a solder drop for forming a bump shifts slightly from the center of the electrode pad due to receiving a strongly blown gas. As a method for correcting this shift from the center of the electrode pad of the solder drop, the following method may be used.

Figure 16A:
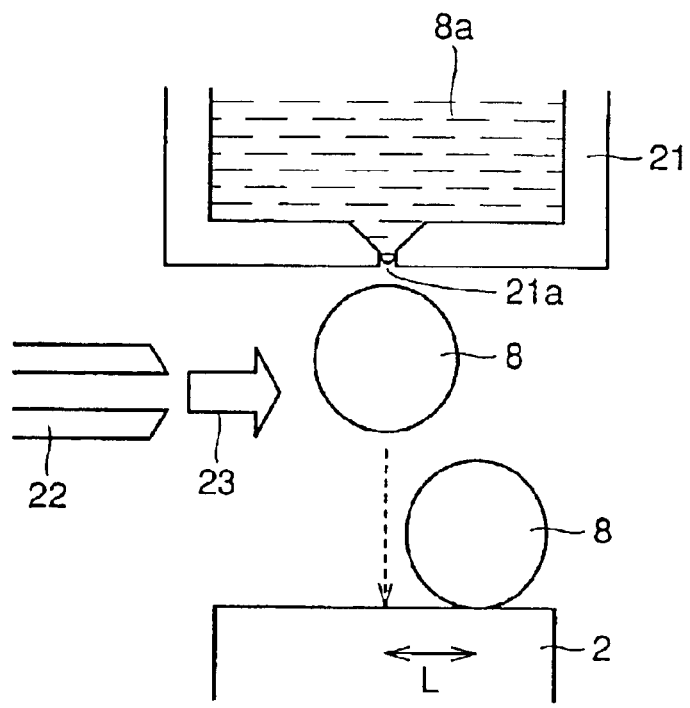
Figure 16B:
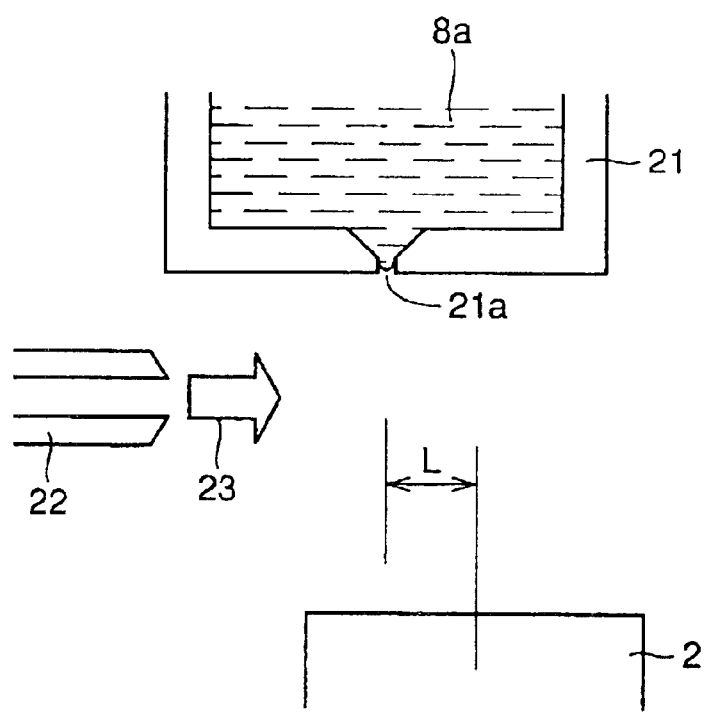
Figure 17:
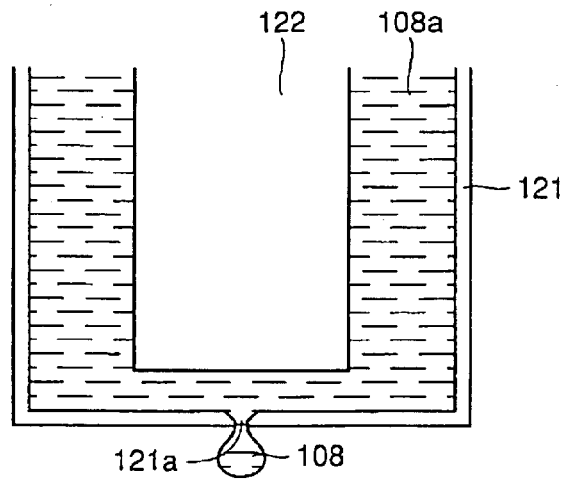
FIG. 17 is a cross sectional view showing a general solder jet-type nozzle.

As shown in FIG. 16A, a standard solder drop 8 reaches the position that is shifted by L from the center of electrode pad 2 due to the gas blowing from blowing nozzle 22 in the direction 23 that crosses the direction of the discharge of the solder drop. In such a case, by using an apparatus shown in FIG. 16B according to the present embodiment, the shifting in the horizontal direction of the solder drop due to the effect of the gas that blows away the satellites can be avoided. FIG. 16B is a view showing a bump formation apparatus according to a fifth embodiment of the present invention. In the bump formation apparatus of the present invention in FIG. 16B, a microscopic aperture 21a of the nozzle is positioned in advance so as to shift from the center of the electrode pad by the distance of shift L shown in the above FIG. 16A. Due to this arrangement including shift, a solder drop of a standard size reaches to and is joined to the center of electrode pad 2. It is desirable for the substrate and blowing gas to be heated to approximately 185° C. in the same manner as in the fourth embodiment.

By using the above described bump formation apparatus, satellites are excluded through a simple technique and a bump can be formed at the center of the electrode pad.

Though the embodiments of the present invention are described above, the above disclosed embodiments of the present invention are solely illustrative and the scope of the present invention is not limited to these embodiments of the invention. The scope of the present invention indicated by the description of the claims and further include the meanings equivalent to the descriptions in the claims and all of the modifications within the scope of the invention.

Industrial Applicability

According to a bump formation method using a dummy film of the present invention, satellites that may accompany the discharge of a solder drop can be removed through a method of forming a bump lower portion electrode structure that is made simpler than the conventional method of forming a bump lower portion electrode structure. Therefore, a semiconductor device of a high reliability can be provided while achieving a reduction in the number of steps and a reduction in the manufacturing cost. In addition, satellites are easily excluded by means of a bump formation method that uses a gas that blows away the satellites so that a semiconductor device of a high reliability can be gained.

What is claimed is:

1. A bump formation method for forming a bump on an electrode pad on a work piece using a solder jet system that discharges a molten solder through a nozzle, the method comprising:
    forming on a work piece a coating layer having a portion that temporarily protects the work piece;
    discharging a drop of molten solder from a nozzle toward an electrode pad on the work piece and toward the coating layer; and
    removing the coating layer, other than beneath the solder drop.

2. The bump formation method according to claim 1, wherein forming a coating layer includes forming a conductive layer on the electrode pad and on the work piece, other than where the electrode pad is located, and removing the conductive layer includes not removing the conductive layer between the electrode pad and the solder drop, and removing the conductive layer elsewhere.

3. The bump formation method according to claim 2, wherein the conductive layer includes a barrier layer that contacts the electrode pad and a connection layer that contacts the solder drop contacting the barrier layer.

4. The bump formation method according to claim 3, wherein the electrode pad is aluminum, the barrier layer includes a titanium film and a nickel film, and the connection layer includes a gold film.

5. The bump formation method according to claim 4, comprising:
    removing the gold film using at least one of an etchant selected from the group consisting of a mixture of iodine and potassium iodide and a mixture of potassium cyanide and an oxidizing agent;
    removing the nickel film using at least one of an ammonium persulfate-based solution and a nitrate-based solution; and
    removing the titanium film using at least one of an etchant selected from the group consisting of a mixture of fluoric acid and nitric acid, and a mixture of a chelating agent and hydrogen peroxide, and fluoric acid.

6. The bump formation method according to claim 2, including removing the conductive layer by etching using an etchant that etches the conductive layer and more slowly etches the solder drop.

7. The bump formation method according to claim 1, including
    forming an insulating film on the work piece in a portion other than where the electrode pad is located, and forming a conductive layer on the electrode pad and on the insulating film, other than where the electrode pad is located, and
    removing the conductive layer in a portion other than between the solder drop and the electrode pad, and removing the insulating film.

8. The bump formation method according to claim 7, wherein the conductive layer includes a barrier layer that contacts the electrode pad and a connection layer that contacts the solder drop contacting the barrier layer.

9. The bump formation method according to claim 8, wherein the electrode pad is aluminum, the barrier layer includes a titanium film and a nickel film, and the connection layer includes a gold film.

10. The bump formation method according to claim 9, comprising:
    removing the gold film using at least one of an etchant selected from the group consisting of a mixture of iodine and potassium iodide and a mixture of potassium cyanide and an oxidizing agent;
    removing the nickel film using at least one of an ammonium persulfate-based solution and a nitrate-based solution; and
    removing the titanium film using at least one of an etchant selected from the group consisting of a mixture of fluoric acid and nitric acid, and a mixture of a chelating agent and hydrogen peroxide, and fluoric acid.

11. The bump formation method according to claim 7, including removing the conductive layer by etching using an etchant that etches the conductive layer and more slowly etches the solder drop.

12. The bump formation method according to claim 7, including removing said insulating film using a chemical solution that does not dissolve the solder.

13. The bump formation method according to claim 12, wherein said insulating film is a resist film and removing said insulating film comprises peeling said resist film using an organic alkaline peeling liquid.

14. A bump formation method for forming a bump on an electrode pad on a work piece using a solder jet system that discharges a drop of molten solder through a nozzle, the method including:

discharging a drop of molten solder from a nozzle so that the drop falls in a direction toward an electrode pads; and preventing attachment to the electrode pad of microscopic drops of molten solder falling together with the drop of molten solder from the nozzle by blowing a gas between the nozzle and the work piece, in a direction transverse to the direction in which the drop of molten solder falls from the nozzle.

15. The bump formation method according to claim 14, wherein at least one of the position of the nozzle, the direction of the nozzle, and the position of the work piece, on which the electrode pad is located, is shifted in position to compensate for displacement of the drop of molten solder by the blowing of the gas as the drop of molten solder falls from the nozzle toward the electrode pad so the drop of molten solder reaches the electrode pad.

16. The bump formation method according to claim 14, wherein the gas is selected from the group consisting of at least one of an inactive gas and a reducing gas.

17. The bump formation method according to claim 14, wherein the gas has a temperature in a range from room temperature to the solder melting temperature.

* * * * *